United States Patent [19]

deBarbadillo, II et al.

[11] Patent Number: 4,962,084

[45] Date of Patent: Oct. 9, 1990

[54] PRODUCTION OF OXIDIC SUPERCONDUCTOR PRECURSORS

[75] Inventors: John J. deBarbadillo, II, Barboursville; Gaylord D. Smith, Huntington, both of W. Va.

[73] Assignee: INCO Alloys International, Inc., Huntington, W. Va.

[21] Appl. No.: 180,374

[22] Filed: Apr. 12, 1988

[51] Int. Cl.$^5$ .................... H01L 39/12; H01L 5/08; H01L 39/24
[52] U.S. Cl. .................... 419/19; 505/736; 505/1; 419/22; 419/33; 419/49; 75/352
[58] Field of Search ............ 419/19, 22, 33, 49; 505/1, 736; 75/0.5 B, 0.5 A

[56] References Cited

U.S. PATENT DOCUMENTS

| | | | |
|---|---|---|---|
| 3,591,362 | 7/1971 | Benjamin | 75/251 |
| 4,761,263 | 8/1988 | Politis et al. | 419/33 |
| 4,826,808 | 5/1989 | Yurek et al. | 505/1 |

FOREIGN PATENT DOCUMENTS

| | | |
|---|---|---|
| 63-265853 | 11/1988 | Japan. |
| WO88/10010 | 12/1988 | PCT Int'l Appl.. |
| 1254542 | 11/1971 | United Kingdom. |

OTHER PUBLICATIONS

"Formation of Perovskite Surface etc.," Gruen et al., J. Elect. Chem. Society, vol. 134, No. 6, Jun. 1987.
Chem. Abs. 107-248033e, "Synthesis of a Superconducting etc. Metall. Trans. A", 1987, 18A(10) 1813-1817.
Chem. Abs. 107-247604d, "Direct Synthesis of a Metal-/etc.," J. Elect. Chem. Soc., 1987, 134(10) 2635-6.
"Superconducting Microcomposites by etc.," Yurek et al., Journal of Metals, Jan. 1988, pp. 16-18.
Preparation of a High Tc Superconductor by Oxidization of a Amorphous $La_{1.8}Sr_{0.2}Cu$ Alloy Ribbon in Air, Matsuzaki et al., pp. L334-L336, Apr. 1987.

*Primary Examiner*—Stephen J. Lechert, Jr.
*Attorney, Agent, or Firm*—Francis J. Mulligan, Jr.; Edward A. Steen

[57] ABSTRACT

A process for producing an oxidic superconductor precursor alloy which comprises mechanicallly allowing metallic elemental constituents of the oxidic superconductor in stoichiometric proportions and in the presence of a process control agent non-detrimental to the superconductor to provide a uniform mechanically alloyed product which is compacted and worked to provide a product form such as wire, tape or thin strip. This product form can then be given the configuration required for use (e.g. open coil) and then oxidized to provide the superconductor.

7 Claims, No Drawings

PRODUCTION OF OXIDIC SUPERCONDUCTOR PRECURSORS

The present invention is concerned with the manufacture of oxidic-type superconductors and, most particularly, with the manufacture of a precursor material for production of oxidic-type superconductors in useful forms of wire, tape, thin films, items useful in construction of Josephson effect devices and the like.

BACKGROUND OF THE INVENTION

As is well known to the entire world, in the last two years superconductor research has undergone a revolution principally based upon the discovery by Nobel laureates J. G. Bednorz and K. A. Mueller that oxidic-type superconductors exist which have critical temperatures (Tc) above about 45° K. During 1987 and in 1988 to date, researchers around the world have reported on various oxide compositions which reportedly have Tc's ranging up to 273° K. and beyond. While, as applicants' understand it at the time of the present writing, claims of very high Tc's for oxidic-type superconductors are based upon detections of the Meissner effect which have been ephemeral and non-repeatable, it is intended that the scope of this application not be limited to any particular oxidic compound or any particular oxidic system so long as the material in question has use in the superconducting field.

A quick survey of the recent technical literature through Chemical Abstracts has indicated that the following oxidic materials including compounds, phases, mixtures, doped materials, etc. have been proposed for superconducting use:

$YBa_2Cu_3O_{7-.31 x}$
$MBa_2Cu_3O_7$ M=Nd, Dy, Er, TM or mixtures
$MBa_2Cu_3O_6$ M=Sa, Ho
$La_{2-x}Sn_xCuO_4$
$La_2CuO_4$ doped with fluorine
$YBa_2Cu_3O_{6.8}$ doped with fluorine
$EuBa_2Cu_3O_{9-x}$
$EuBa_2(Cu_{1-y}M_y)_3O_{9-x}$ M=Cr, Mn, Fe, Co, Ni or Zn
$GdBaCu_3O_{7-x}$
$Ba_2SmCu_3O_{9-x}$
$InSnO_2$
$La_{2-x}M_xCuO_4$
$La_{2-x}Sr_xCuO_4$
$Ba_2YCu_3O_{9-y}$
$GdBa_2Cu_3O_{7-x}$
$YBa_2(Cu_{1-x}Fe_x)_3O_{7-y}$
$Y_{1.2}Ba_{0.8})_4Cu_4O_{16-x}$
$YBa_3Cu_3O_yF_x$
$Y_{3-x}Ba_xCu_2O_{7-y}$
Bi-Sr-Cu-O system
$La_{3-x}Ba_{3-x}Cu_6O_{14-y}$
$YBa_2Cu_3O_{7-x}S_y$
$EuBa_2Cu_3O_x$
$YBa_2Cu_3O_{9-y}$
$La_{1.85}Sr_{0.15}CuO_4$
$Ba_2RCu_3O_x$ R=Gd, Ho, Er or Dy
$YBa_2(Cu_{1-x}Ag_x)_3O_{7-y}$
$YBa_2(CuO_{0.94}FeO_{0.06})_3O_{9-y}$
$YBa_2Ag_3O_x$
$La_2CuO_{4-y}$
$Dy_xBa_{1-x}CuO_{3-y}$
Molybdenum Oxides and Bronzes—Alkali Molybdenum Bronze
$(Y, Ho)Ba_2Cu_3O_7$
Nb, Si, Al oxides Japanese Pat. Appln. No. 87-170,108
Ge, Al, Nb oxides Japanese Pat. Appln. No. 87-171,924
$BaPb_{1-x}Bi_xO_3$
$Nb/Al-Al_2O_3$
$Nb/Ge-Al-O$
Pb, Bi, In oxides
$Li_{1-x}Ti_{2-x}O_4$
$TlCaBa_2Cu_2O_{8+x}$ where x 1
$TlCa_2Ba_2Cu_3O_{10+x}$)

Those acquainted with the art will appreciate that the foregoing list of oxidic superconductors (or more accurately materials suggested for superconductor use) is not exhaustive and is increasing on a day-to-day basis. For example, on page 36 of the April 1988 edition of Scientific American a new superconductor is reported as composed of bismuth, strontium, calcium, copper and oxygen. The superconductor reportedly having a Tc as high as 84° K. apparently can also contain aluminum. Those persons will also appreciate that where exact compositions are listed, in reality any element in the composition may be present in a sub- or super-stoichiometrical amount and may be limited to or substituted in whole or in part with a particular isotope of the element in question such as $O^{18}$, $Gd^{155}$, etc. The superconductor composition may also be doped with metals, metalloids and non-metals. Each and all of these variations and others are contemplated within the term "oxidic superconducting materials" as employed in this specification and claims. Currently, known ways of preparing such oxidic super-conducting materials are disclosed in the review by M. Hirabayashi in Nippon Kinzoku Gakkai Kaiho 1987, 26(10), pages 943–949, Chemical Abstract Reference 108-66605f. Those skilled in the art appreciate that oxidic superconductors are essentially ceramic-like materials which are not readily formable into desirable product configurations such as wire, tape, coils, etc. The purpose of the present invention is to provide an improved method of making essentially metallic alloy superconductor precursors which can be formed into product configuration and then oxidized in place and in required configuration.

DESCRIPTION OF THE INVENTION

The present invention contemplates providing an essentially metallic precursor of an oxidic semiconductor by mechanical alloying powder form metallic (including semi-metallic) elements or compounds thereof in ratios equivalent to the ratios in the desired oxidic superconducting material to provide a mechanically alloyed metal powder and thereafter compacting, sintering and solid state working of such mechanically alloyed metal powder to a required structural form suitable for superconducting use. The mechanical alloying charge can also include amounts of an inoxidizable metal such as silver, platinum, rhodium, gold, palladium, etc. which can form a metallic phase in the oxidic superconductor product. This inoxidizable metal, when present, can be present in relatively large amounts, for example, up to about 70% of the metallic charge fed to the mechanical alloying process, e.g. an amount equal or more in weight to the metallic elements intended to be oxidized.

In explanation, it is assumed that a device using a superconductor requires the superconductor in the form of a thin tape perhaps 150 micrometers thick. The metallic product of mechanical alloying advantageously would be compacted by hot isostatic pressing, vacuum hot pressing or the like, extruded in the solid state to bar form and then rolled to a thin gage strip. This thin gage strip is then formed to the configuration required, e.g. an open coil on a heat resistant insulative base, and subsequently oxidized in situ and in forma to the required oxidic superconductor.

As used in this specification and claims, the term "mechanically alloying" refers to a process invented by John Benjamin which was the subject of a series of U.S. patents, particularly U.S. Pat. Nos. 3,591,362, 3,591,349 and 3,696,486 and variants thereof. In mechanical alloying a charge of metal or metalloid powder with or without non-metallic added ingredients is fed to a zone of impacting elements such as hardened steel balls in a conventional rotary, horizontal ball mill or an attriting device such as a Szegvari attritor and milled therein advantageously in the presence of a processing aid to cause multiple fracturing and welding of charge ingredients until such time (a) that one cannot readily detect by optical means a laminated structure in the particles of the worked charge and (b) that substantial saturation hardness is reached. The function of the processing aid is to prevent, on the one hand, grinding the charge to ultra fine material and on the other hand to prevent massive welding of the particles into large undesired chunks. For purposes of mechanical alloying, at least one of the charge metal powders (including alloy powders) should be malleable to enhance inter-mingling of the alloy ingredients through a flattening, welding, folding, fracturing, flattening—and infinitum—sequence of alloying operations. In a great many instances of oxidic superconductor materials, copper, an exemplary malleable metal is a major ingredient.

In making oxidic superconductor precursors by mechanical alloying, it is generally necessary to employ as a process control agent (processing aid) a material which is not detrimental to the superconductor. Oxygen is such a material and can be used in gaseous or metal compound form up to a level, e.g. up to about 1% or 2% by weight which will not drastically degrade metal alloy working characteristics. In carrying out the mechanical alloying process to produce oxidic superconductor precursors, it is advantageous to mechanically alloy powder ingredients in an atmosphere inert to the ingredients such as an argon or helium or hydrogen atmosphere and (with the exception of the hydrogen atmosphere) bleed in gaseous oxygen as the process control agent over the time of mechanical alloying. If oxygen isotope modification is desired, the gaseous oxygen process control agent can be or be modified to contain an enhanced amount of $O^{17}$ or $O^{18}$ or any other isotope of oxygen. While isotope modification could be carried out during oxidation, if the modification desired in the superconductor is within the percentage range represented by the permissible percent by weight of oxygen as a process control agent, then using the isotope during mechanical alloying is most efficient because it is used essentially in a closed system.

As stated before, oxygen as a process control agent can be employed as a compound, for example, $CuO_2$, $H_2O$, $BaO_2$, $SrO_2$ or the like. If such a compound is used, it is advantageous to add it periodically or continuously during mechanical alloying so that an effective amount of processing aid is present over the whole or substantially the whole time of the operation. Other materials which can be used as processing aids include but are not limited to water vapor, hydrogen peroxide vapor, and oxides of copper other than copper peroxide.

From the list of proposed oxidic superconductors set forth hereinbefore, it is to be noted that it has been suggested that certain compounds be doped with or caused to contain fluorine or sulfur in place of or in addition to oxygen. Such halide and chalcogenide dopants can be included in whole or in part in the oxidic superconductor precursor during the mechanical alloying process either as a modifier to a process control agent or as an initial charge ingredient provided that the total of the dopant form, e.g. metal fluoride and the form of the residue of the process control agent, e.g. metal oxide do not limit the formability of the precursor to preclude manufacture of the ultimate product configuration. As a ball park figure the total of oxygen, fluorine and sulfur introduced into the precursor during mechanical alloying should not exceed about 4% by weight of the precursor alloy.

Metallic dopants such as silver, chromium, manganese, iron, cobalt, nickel, zinc, uncommon lanthanides, etc. which are indicated in the art as having utility in oxidic superconductors can be used in practically any amount in metallic form in the mechanical alloying charge used in the process of the present invention. If the metallic dopant is only available in oxide form, such as may be the case for some of the rarer lanthanides, the inclusion of such oxide in a mechanical alloying charge is limited as is the processing aid and the halide and chalcogenide dopant. If such rare lanthanide oxide is employed, the oxygen therein should be subject to the aforestated 4% maximum total, oxygen plus fluorine plus sulfur.

In order to give those skilled in the art a greater appreciation of the present invention, the following Examples are given:

EXAMPLE I

A precursor alloy for the superconductor $YBa_2Cu_3O_{7-y}$ is made by mechanically alloying 133 parts by weight of yttrium powder along with 412 parts by weight of barium powder and 286 parts by weight of copper powder in an argon atmosphere in a Szegvari attritor in the presence of hardened steel balls in an amount of about 30:1 ratio balls to the total powder charged. During mechanical alloying which takes upwards of 4 hours, oxygen is bled into the attritor enclosure in a total amount of about 0.8% by weight of the charged powder. Advantageously the attritor is equipped with a cooling jacket continuously fed with chilled water to prevent the temperature internal of the attritor from exceeding about 200° C. When mechanical alloying is complete, the powder charge is removed from the attritor, screened to remove fines passing through a 44 micrometer screen and large particles retained on a 1000 micrometer screen and then compacted by hot isostatic pressing at a temperature below about 450° C. The compact is then extruded at a temperature between 350° C. and 450° C. and the extruded compact is hot rolled in the same temperature range to strip about 0.6 cm thick. The hot rolled strip having essentially 100% density and an oxygen content of less than 1% is then cold rolled with intermediate annealing to desired gage of oxidic superconductor precursor alloy. During hot or cold rolling strips or edges of inoxidizable metal such as silver, gold, gold encased copper or aluminum or the like can be provided in or on the oxidic superconductor precursor alloy by composite rolling of the precursor alloy with preformed inoxidizable metal structures, e.g. wires or strip.

EXAMPLE II

A precursor alloy for the oxidic superconductor $La_2CuO_4$ doped with fluorine is made by mechanically alloying a charge comprising 872 parts by weight of lanthanum powder, 170 parts by weight of copper powder and 39 parts by weight of cuprous fluoride powder in the same manner as is done in Example I. The mechanically alloyed powder product contains less than 1% oxygen and about 0.25% fluorine. This product is compacted, extruded and hot worked as in Example I except that the hot compaction is done at a temperature less than about 700° C. and the extrusion and hot rolling is done within the temperature range of about 550° C. to 675° C.

EXAMPLE III

A $BaPb_{0.75}Bi_{0.25}O_3$ superconductor precursor is made by mechanical alloying 962 parts by weight of barium powder, 1088 parts by weight of lead powder and 366 parts by weight of bismuth powder in a jacketed Szegvari attritor having a coolant with a maximum exit temperature of about 0° C. circulating in the jacket. The mechanical alloying is carried out under an argon or other inert atmosphere, with oxygen as a process control agent bled into the attritor at a rate so as to produce about 2% oxygen in the attrited powder product and with a ball-to-powder ratio as set forth in Example I. The attrited powder product is then compacted and worked at room temperature (said working technically being hot working with regard to this specific material). Cold working to final gage is advantageously conducted under cryogenic conditions.

The foregoing Examples teach the production of oxide superconductor precursors especially in thin strip form. The advantage of such precursors is essentially alloy uniformity compared to precursors made by melt technology. Even with very rapid cooling, precursor alloys made by melting tend to form segregated phases which produce zones or volumes of discontinuity in the subsequently oxidized products. In order to maintain the uniformity of structure provided by mechanical alloying, the precursor alloy should be oxidized at a temperature which avoids production of any liquid phase. In general, the temperature of oxidation should be limited to the permissible temperature of solid state hot working. Thus, while oxidation processes such as continuous zone thermal oxidation may be applicable to some precursor alloys, with others, especially those of the type produced in Example III, special cold oxidation must be employed. It is contemplated that cold ozonization, low temperature reaction with oxygen free radicals and like processes will be employed in cases where normal thermally induced oxidation in air, oxygen or like atmospheres cannot be conducted without danger of melting the mechanically alloyed superconductor precursor alloy. As those skilled in the art will appreciate, oxidation can be enhanced or accelerated by use of oxidation catalysts or enhancers (e.g. water vapor) which do not adversely effect the ultimate oxidic superconductor.

The present invention also contemplates zone annealing of elongated forms of the mechanically alloyed precursor alloy at a temperature between the incipient recrystallization temperature of the alloy and the melting temperature of the lowest melting phase formed by the mechanically alloyed ingredients and carried out in an inert atmosphere. By zone allealing wires or strips of the mechanically alloyed precursor alloy, especially after cold work, the alloy crystals are enlarged and elongated to provide an advantageous basis for the texture of superconducting oxide produced therefrom.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows.

1. A process for production of a metallic precursor of an oxidic superconductor comprising mechanical alloying powders containing the metallic elemental components of said oxidic superconductor in the presence of a process control agent non-detrimental to said oxidic superconductor, said metallic elemental components being in the proportion relative to each other required in said oxidic superconductor, compacting and working the product of said mechanical alloying to provide a metal precursor alloy adaptable for forming to a required superconductor configuration.

2. A process as in claim 1 wherein said powders containing the metallic elemental components and process control agent mechanically alloyed include at least a part of any required dopant and modifier.

3. A process as in claim 1 wherein said process control agent is oxygen.

4. A process as in claim 3 wherein said oxygen in gaseous state is bled into a covering inert atmosphere during mechanical alloying.

5. A process as in claim 2 wherein at least a part of any required dopant and modifier is included with said process control agent.

6. A process as in claim 1 wherein the powder being mechanically alloyed includes powder of an inoxidizable metal.

7. A process as in claim 6 wherein during working after compacting a continuum of inoxidizable metal is formed in association with said metal precursor alloy.

* * * * *